United States Patent
Alm

(10) Patent No.: US 7,335,931 B2
(45) Date of Patent: Feb. 26, 2008

(54) MONOLITHIC MICROWAVE INTEGRATED CIRCUIT COMPATIBLE FET STRUCTURE

(75) Inventor: Roberto W. Alm, Windham, NH (US)

(73) Assignee: Raytheon Company, Waltham, MA (US)

( * ) Notice: Subject to any disclaimer, the term of this patent is extended or adjusted under 35 U.S.C. 154(b) by 119 days.

(21) Appl. No.: 11/015,687

(22) Filed: Dec. 17, 2004

(65) Prior Publication Data

US 2006/0131620 A1   Jun. 22, 2006

(51) Int. Cl.
  *H01L 29/80*   (2006.01)
  *H01L 31/112*  (2006.01)

(52) U.S. Cl. .................. 257/276; 257/275; 257/522; 257/E23.013

(58) Field of Classification Search ................ 257/259, 257/662, 275–277, 664, 728, 522, E23.013
  See application file for complete search history.

(56) References Cited

U.S. PATENT DOCUMENTS

| | | | |
|---|---|---|---|
| 4,479,260 A | | 10/1984 | Harrop |
| 4,736,454 A | | 4/1988 | Hirsch |
| 4,959,705 A | * | 9/1990 | Lemnios et al. ............ 257/532 |
| 4,974,039 A | | 11/1990 | Schindler et al. |
| 4,992,764 A | * | 2/1991 | Ayasli ..................... 333/247 |
| 5,734,189 A | | 3/1998 | Pribble |
| 6,081,006 A | * | 6/2000 | Nelson ..................... 257/276 |
| 6,252,266 B1 | * | 6/2001 | Hoshi et al. ................ 257/276 |
| 2001/0017556 A1 | | 8/2001 | Tokumitsu et al. |
| 2002/0030267 A1 | * | 3/2002 | Suzuki ...................... 257/698 |

FOREIGN PATENT DOCUMENTS

JP   63-240102   *   5/1988

OTHER PUBLICATIONS

MSN Encarta Dictionary www.encarta.msn.com.*
PCT/US2005/033569 International Search Report dated Jan. 31, 2006.

* cited by examiner

*Primary Examiner*—Monica Lewis
(74) *Attorney, Agent, or Firm*—Daly, Crowley, Mofford & Durkee, LLP

(57) ABSTRACT

A field effect transistor structure includes a single crystal substrate having: a source, gate and drain electrodes disposed on an upper surface of the substrate, the gate electrode having a region thereof disposed between a region of the drain electrode and a region of the source electrode; a ground conductor disposed on a lower surface of the substrate; a plurality of electrically conductive vias passing through the substrate, each one of the vias having one end electrically connected to a different region of the ground conductor and having another end electrically connected to the gate electrode. The plurality of electrically conductive vias provide parallel and symmetric connections between the gate electrode and the ground conductor.

18 Claims, 4 Drawing Sheets

MONOLITHIC MICROWAVE INTEGRATED CIRCUIT COMPATIBLE FET STRUCTURE

TECHNICAL FIELD

This invention relates generally to Field Effect Transistor (FET) structures and more particularly to FET structures compatible with Monolithic Microwave Integrated Circuits (MMICs).

BACKGROUND

As is known in the art, FETs are used in MMICs in a wide variety of applications. One FET configuration is shown in FIG. 1 to include a gate electrode disposed on an upper surface of a single crystal substrate structure. The gate electrode has a plurality of fingers; pairs thereof being disposed on each side of a corresponding one of a plurality of fingers of a drain electrode also disposed on the upper surface of the structure. The source electrode includes a plurality of source pads disposed on the upper surface of the structure between other pairs of the gate fingers as shown in FIG. 1. The source pads are connected through vias passing through the structure to a common source electrode, or ground plane, not shown, disposed on the lower, or bottom, surface of the structure.

At lower frequencies, the topology described above and shown in FIG. 1, is also used with the multiple-source pads, interconnected by an air-bridge conductors, not shown, disposed over the upper surface of the structure and grounded to a ground plane on the lower surface of the structure with vias at the two end source pads.

As is also known in the art, one application for a FET is in an oscillator circuit. A commonly used oscillator circuit uses a grounded gate electrode. Thus, it is difficult to use the FET structure described above in connection with FIG. 1 in a common-gate (i.e., grounded gate) configuration because devices using the structure in FIG. 1 are very unstable unless parasitic inductances and capacitances in the gate circuits are minimized. In the device of FIG. 1, the individual gate fingers are connected to a common gate "bar" or pad, as shown, and this distribution of gate fingers, along with the bar, creates significant parasitic inductances and capacitances particularly at millimeter (mm) wavelength operation. Furthermore, it is ambiguous as to how to model exactly where the gate feed point is from an external (to the device) perspective for circuit design. These ambiguities, along with the unwanted gate parasitics, tend to make common-gate structures very difficult at high frequencies, and often result in multiple design iterations in order to achieve success.

SUMMARY

In accordance with the present invention, a field effect transistor structure is provided having: a single crystal substrate; such structure having a source, gate and drain electrodes disposed on an upper surface of the substrate, the gate electrode having a region thereof disposed between a region of the drain electrode and a region of the source electrode. The structure includes a ground conductor disposed on a lower surface of the substrate. A plurality of electrically conductive vias pass through the substrate, each one of the vias having one end electrically connected to a different region of the ground conductor and having another end electrically connected to the gate electrode.

In one embodiment, the plurality of electrically conductive vias provides parallel and symmetric connections between the gate electrode and the ground conductor.

In one embodiment, the transistor includes a conductive strip disposed over the upper surface of the substrate, such conductive strip having a first end connected to a region of the gate electrode disposed between outer ends of the gate electrode and wherein said another end of each one of the plurality of vias is connected to a second end of said conductive strip.

In one embodiment, said another end of each one of the plurality of conductive vias is connected to the second end of the conductive strip by a corresponding one of a plurality of conductive bridges.

In one embodiment, each one of the bridges is elevated from the upper surface of the substrate with air being disposed between the bridges and such substrate.

In one embodiment, the bridges provide electrical inductance.

In one embodiment, a proximal region of the gate electrode is disposed between the source electrode and the drain electrode and wherein distal ends of the gate electrode are connected to said another end of each one of the plurality of vias.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
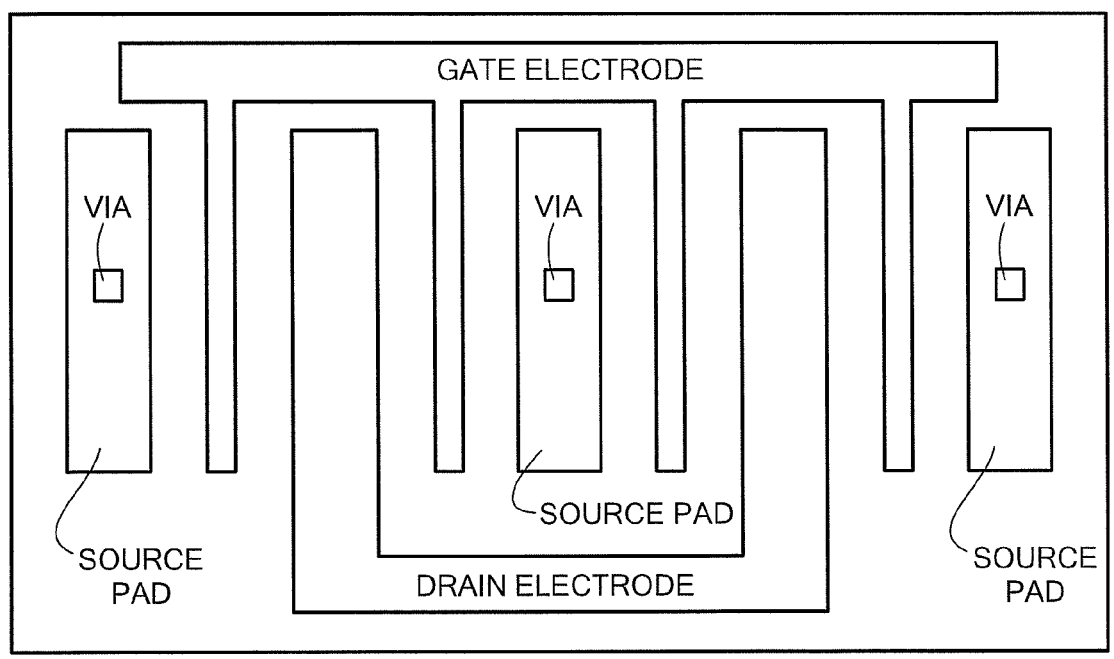
FIG. 1 is a diagram of a top elevation view of a FET according to the PRIOR ART.
Figure 2A:
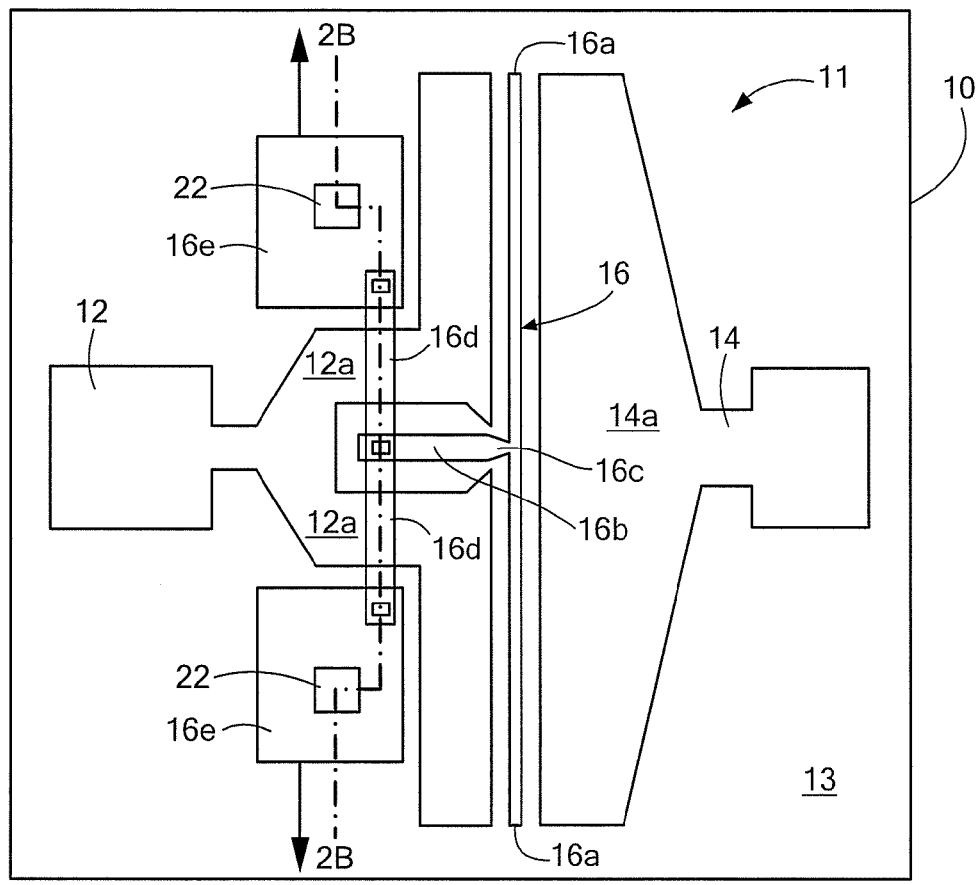
FIG. 2A is a diagram of a top view of a FET according to the invention.
Figure 2B:
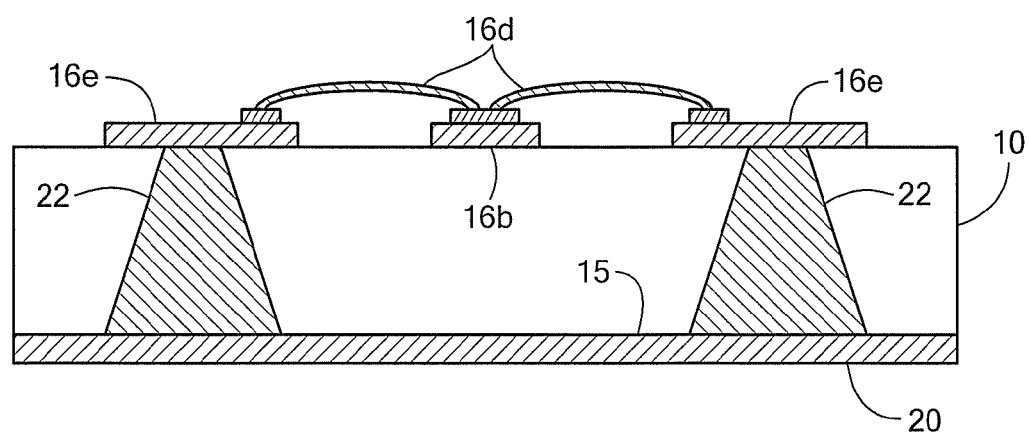
FIG. 2B is a cross-sectional diagram of the FET of FIG. 2A, such cross section being taken along line 2B-2B of FIG. 2A.

Referring now to FIGS. 2A and 2B, a single crystal substrate structure 10, a GaAs, for example, has formed therein a field effect transistor (FET) 11. More particularly, the FET includes a source electrode 12, a drain electrode 14, and a gate electrode 16 formed in any conventional manner on the upper surface 13 of the structure 10. Thus, the gate electrode 16 has a region 16a thereof disposed between a region 16a of the drain electrode 16 and regions 12a of the source electrode 12. The region 16a of the gate electrode 16 is here in Schottky contact with the structure 10 while the regions 12a, 14a of the source and drain electrodes 12, 14 are in ohmic contact with the structure 10. Thus, the gate electrode 16 is used to control the flow of carriers between the source electrode 12 and the drain electrode 14.

The structure 10 includes a ground conductor 20 (FIG. 2B) disposed on a lower surface 15 of the substrate 10. The structure 10 also includes a plurality of electrically conductive vias 22 passing through the substrate structure 10, each one of the vias 22 having one end electrically connected to a different region of the ground conductor 20 and having another end electrically connected to the gate electrode 16. The plurality of electrically conductive vias 22 provide parallel and symmetric connections between the gate electrode 16 and the ground conductor 20.

Here, in this embodiment, gate electrode 16 includes a conductive strip 16b disposed over the upper surface 13 of the substrate structure 10. The conductive strip 16b has a first end connected to a mid-point 16c of the region 16a of the gate electrode 16 disposed between outer ends of the region 16a of the gate electrode 16. The gate electrode 16 also includes a pair of conductive strips 16d having mid portions elevated over the upper surface 13 of the substrate structure 10. The conductive strips 16d each have first ends connected to a second end of the conductive strip 16b and a second end connected to a corresponding one of a pair of conductive pads 16e of the gate electrode 16. The conductive pads 16e are connected to the common conductor 20 through a corresponding one of the pair of conductive vias 22. Thus, the region 16a of the gate electrode 16 is electrically connected to the common conductor 20 through the pair of vias 22, pair of pads 16e, pair conductive strips 16d, and conductive strip 16b.

Figure 4:
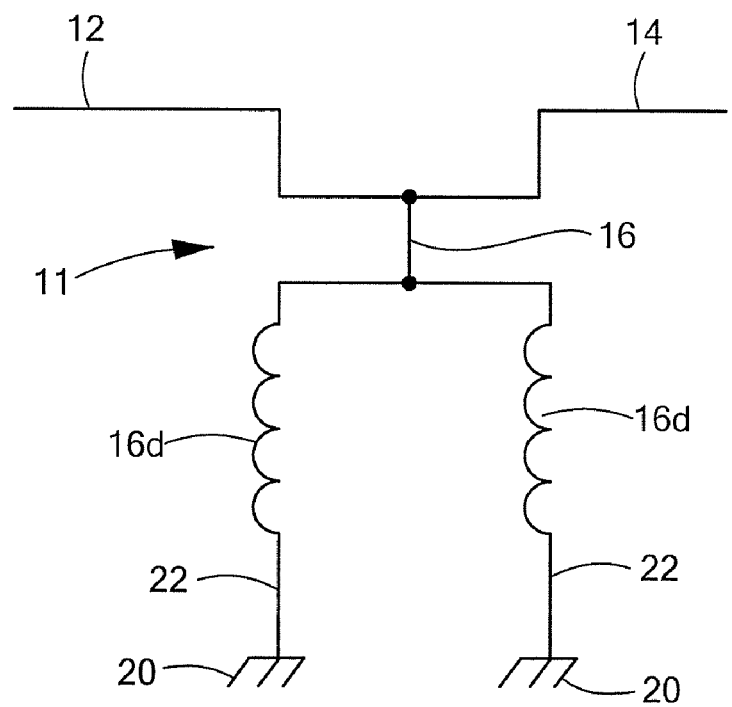
FIG. 4 is a schematic diagram of the FET according to the invention.

It is noted that with the structure shown in FIGS. 2A and 2B, the single-finger center gate feed or gate region 16a is not brought out (for bonding or contact) from the device at all, but is instead grounded using two parallel and symmetric connections to ground. The pair of conductive strips is air-bridge connections made to provide two parallel vias to ground. In this configuration the parasitic inductance and capacitance in the gate circuit (i.e., gate electrode 16) of the FET device 11 shown in FIG. 4 is minimized (as compared to a traditional FET layout where the gate terminal is connected to an RF bonding port), and the common gate configuration can be characterized and used to design mm-wave common-gate based circuits, such as oscillators, mixers, amplifiers et al. with a much higher probability of first-pass success, since in all likelihood the device could be characterized in a biased but stable condition up through the mm-wave bands.

During the design phase the pads may be moved in the directions of the arrows 30. Thus, moving the grounding via pads 16e outward as indicated by the arrows 30 can vary the gate electrode inductance.

Figure 3A:
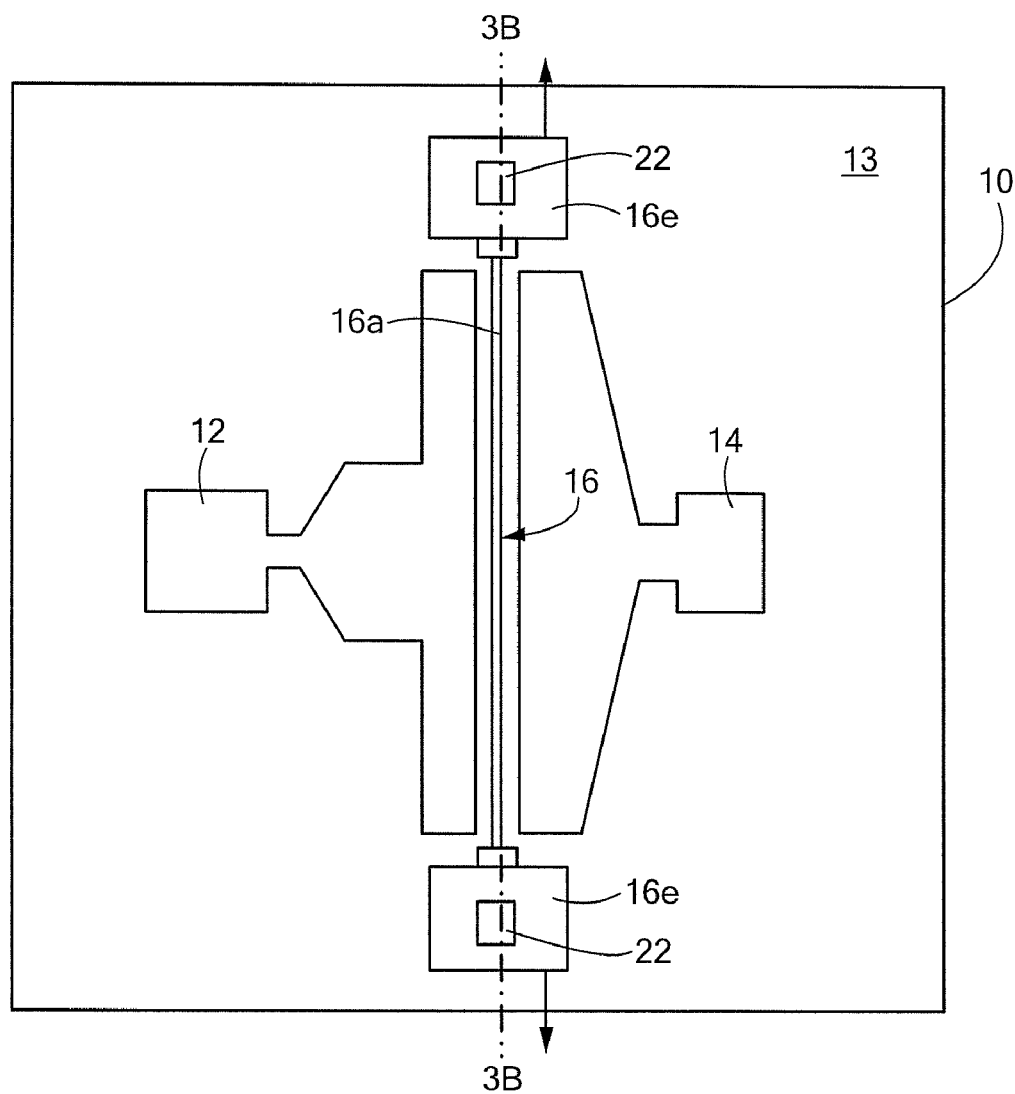
FIG. 3A is a diagram of a top view of a FET according to another embodiment of the invention.
Figure 3B:
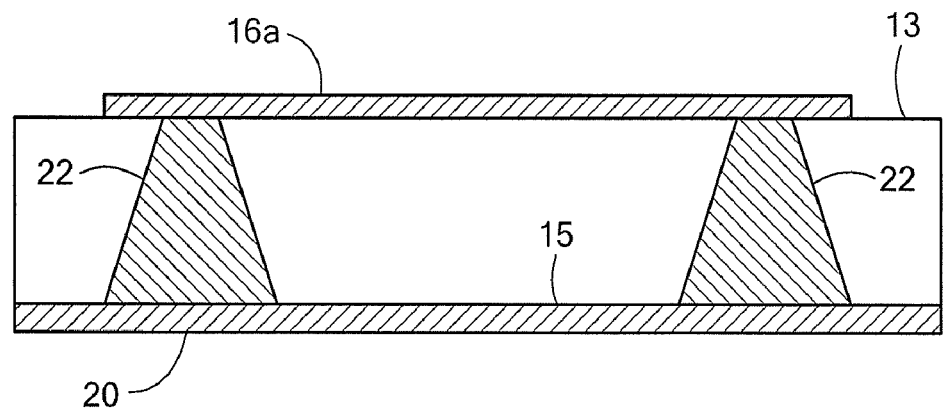
FIG. 3B is a cross-sectional diagram of the FET of FIG. 3A, such cross section being taken along line 3B-3B of FIG. 3A.

Referring now to FIGS. 3A and 3B, an alternate connection of the same concept, but in this case region 16a of the gate electrode 16 is grounded at the ends, and the gate inductance can be varied by moving the grounding via pads 16e outward as indicated by arrow 30. This configuration may be even more stable at the device level. For baseline device characterization, gate inductance can be nearly eliminated. The topology shown in FIGS. 3A and 3B may be a preferred arrangement for very high gain devices and/or for very high frequency applications.

In the case of a mm-Wave FET-based oscillator, the circuit is usually designed in a common gate configuration with inductance inserted in the gate circuit to induce instability. This is usually the orientation of choice as it tends to maximize the instability (desired in this case) and it provides the best flexibility in controlling the instability. In the layout of FIGS. 2A and 2B, the internal inductance is set by the two air bridges in parallel with each other, and by the parallel inductance of the two ground vias, which will be very repeatable. $V_{GS}$ is typically controlled by external bias on the source, and the gate truly is DC+RF Grounded, which provides the necessary DC return to prevent a self back-bias (from rectified RF) condition. Additional parasitic elements in the gate circuit (e.g; bias chokes) are also avoided. The resonator is usually coupled to either the source or drain circuits. Note that a positive voltage on the source generates a relative $-V_{GS}$, thus single-supply operation is possible. (The oscillator is then Self Biased.) A similar discussion is valid for the layout shown in FIGS. 3A and 3B, the only difference being that inductance is controlled by the length of transmission line employed between the gate finger ends and the ground via pads.

In the layout of FIGS. 2A and 2B, there is only one gate feed point, and periphery is easily adjusted without changing the geometry of the feed point. Periphery is usually adjusted to control oscillation frequency—NOT output power (as it is in an amplifier). Output power is set by the subsequent buffer stage(s). Periphery is also easily adjusted in the layout of FIGS. 3A and 3B by simply lengthening the single finger of the device.

A number of embodiments of the invention have been described. Nevertheless, it will be understood that various modifications may be made without departing from the spirit and scope of the invention. Accordingly, other embodiments are within the scope of the following claims.

What is claimed is:

1. A field effect transistor structure comprising:
   a single crystal substrate having:
      a source, gate and drain electrodes disposed on an upper surface of the substrate, the gate electrode having a region thereof disposed between a region of the drain electrode and a region of the source electrode;
      a ground conductor disposed on a lower surface of the substrate;
      a plurality of electrically conductive vias passing through the substrate, each one of the vias having one end electrically connected to a different region of the ground conductor and having another end electrically connected to the gate electrode.

2. The field effect transistor structure recited in claim 1 wherein the plurality of electrically conductive vias provide parallel and symmetric connections between the gate electrode and the ground conductor.

3. The field effect transistor structure recited in claim 1 wherein the transistor includes a pair of conductive strips disposed over the upper surface of the substrate, each one of the pair of conductive strips having a first end portion connected to a region of the gate electrode disposed between outer ends of the gate electrode and wherein said another end of each one of the plurality of vias is connected to a second end portion of a corresponding one of the pair of conductive strips.

4. The field effect transistor structure recited in claim 3 wherein said another end of each one of the plurality of conductive vias is connected to the second end portion of the corresponding one of the pair of conductive strips by a corresponding one of a pair of conductive bridges.

5. The field effect transistor structure recited in claim 4 wherein each one of the bridges is elevated from the upper surface of the substrate with air being disposed between the bridges and such substrate.

6. The field effect transistor structure recited in claim 4 wherein each one of the pair of bridges provides electrical inductance.

7. The field effect transistor structure recited in claim 4 wherein the plurality of electrically conductive vias and bridges provide parallel and symmetric connections between the gate electrode and the ground conductor.

8. The field effect transistor structure recited in claim 1 wherein a proximal region of the gate electrode is disposed between the source electrode and the drain electrode and wherein distal regions of the gate electrode are connected to said another end of each one of the plurality of vias.

9. The field effect transistor structure recited in claim 8 wherein the plurality of electrically conductive vias provide parallel and symmetric connections between the gate electrode and the ground conductor.

10. A field effect transistor structure comprising:
   a single crystal substrate having:
      a source, gate and drain electrodes disposed on an upper surface of the substrate, the gate electrode having a region thereof disposed between a region of the drain electrode and a region of the source electrode;
      a ground conductor disposed on a lower surface of the substrate;
      a plurality of electrically conductive vias passing through the substrate, each one of the vias having one end in contact with a different region of the ground conductor and having another end in contact with the gate electrode.

11. The field effect transistor structure recited in claim 10 wherein the plurality of electrically conductive vias provide parallel and symmetric connections between the gate electrode and the ground conductor.

12. The field effect transistor structure recited in claim 10 wherein the transistor includes a pair of conductive strips disposed over the upper surface of the substrate, each one of the pair of conductive strips having a first end portion connected to a region of the gate electrode disposed between outer ends of the gate electrode and wherein said another end of each one of the plurality of vias is connected to a second end portion of a corresponding one of the pair of conductive strips.

13. The field effect transistor structure recited in claim 12 wherein said another end of each one of the plurality of conductive vias is connected to the second end portion of the corresponding one of the pair of conductive strips by a corresponding one of a pair of conductive bridges.

14. The field effect transistor structure recited in claim 13 wherein each one of the bridges is elevated from the upper surface of the substrate with air being disposed between the bridges and such substrate.

15. The field effect transistor structure recited in claim 13 wherein each one of the pair of bridges provides electrical inductance.

16. The field effect transistor structure recited in claim 4 wherein the plurality of electrically conductive vias and bridges provide parallel and symmetric connections between the gate electrode and the ground conductor.

17. The field effect transistor structure recited in claim 10 wherein a proximal region of the gate electrode is disposed between the source electrode and the drain electrode and wherein distal regions of the gate electrode are connected to said another end of each one of the plurality of vias.

18. The field effect transistor structure recited in claim 17 wherein the plurality of electrically conductive vias provide parallel and symmetric connections between the gate electrode and the ground conductor.

\* \* \* \* \*

UNITED STATES PATENT AND TRADEMARK OFFICE
CERTIFICATE OF CORRECTION

PATENT NO. : 7,335,931 B2  Page 1 of 1
APPLICATION NO. : 11/015687
DATED : February 26, 2008
INVENTOR(S) : Roberto W. Alm It is certified that error appears in the above-identified patent and that said Letters Patent is hereby corrected as shown below:

Title Page, item [57] Abstract, line 2, delete "electrodes" and replace with -- electrode --.

Col. 1, line 29, delete "an air-bridge" and replace with -- air-bridge --.

Col. 2, line 2, delete "provides" and replace with -- provide --.

Col. 3, line 25, delete ", pair conductive" and replace with -- , pair of conductive --.

Col. 3, line 31, delete "is" and replace with -- are --.

Col. 3, line 44, delete "phase the" and replace with -- phase, the --.

Col. 3, line 45, delete "directions" and replace with -- direction --.

Col. 4, line 29, delete "electrodes" and replace with -- electrode --.

Col. 5, line 14, delete "electrodes" and replace with -- electrode --.

Signed and Sealed this

Twelfth Day of August, 2008

JON W. DUDAS
*Director of the United States Patent and Trademark Office*